United States Patent
Yun et al.

(10) Patent No.: US 12,249,394 B2
(45) Date of Patent: Mar. 11, 2025

(54) MULTI-PROTOCOL ANALOG FRONT END CIRCUIT

(71) Applicant: Synopsys, Inc., Mountain View, CA (US)

(72) Inventors: Xiao Yun, Franklin, MA (US); Vladimir Zlatkovic, Belmont, MA (US)

(73) Assignee: Synopsys, Inc., Sunnyvale, CA (US)

( * ) Notice: Subject to any disclaimer, the term of this patent is extended or adjusted under 35 U.S.C. 154(b) by 185 days.

(21) Appl. No.: 17/959,833

(22) Filed: Oct. 4, 2022

(65) Prior Publication Data

US 2023/0111161 A1   Apr. 13, 2023

Related U.S. Application Data

(60) Provisional application No. 63/255,303, filed on Oct. 13, 2021.

(51) Int. Cl.
*G11C 11/4093*  (2006.01)
*G11C 5/06*  (2006.01)
*G11C 7/10*  (2006.01)

(52) U.S. Cl.
CPC .............. *G11C 7/109* (2013.01); *G11C 5/06* (2013.01); *G11C 7/1063* (2013.01)

(58) Field of Classification Search
CPC .......... G11C 7/109; G11C 5/06; G11C 7/1063
See application file for complete search history.

(56) References Cited

U.S. PATENT DOCUMENTS

| | | | |
|---|---|---|---|
| 10,691,255 B1 * | 6/2020 | Lin | G06F 3/04182 |
| 11,128,272 B2 * | 9/2021 | Wu | H04L 27/0002 |
| 11,545,968 B1 * | 1/2023 | Chae | H03F 3/45183 |
| 2008/0238541 A1 * | 10/2008 | Fasoli | G11C 7/02 330/286 |
| 2010/0157698 A1 * | 6/2010 | Barth, Jr. | G11C 11/4091 365/189.15 |
| 2022/0076734 A1 * | 3/2022 | Suzuki | G11C 5/143 |

* cited by examiner

*Primary Examiner* — Min Huang
(74) *Attorney, Agent, or Firm* — Patterson + Sheridan, LLP

(57) ABSTRACT

An apparatus for processing an input signal from a memory includes an attenuator circuit and an analog front end (AFE) circuit. The attenuator circuit attenuates the input signal from the memory to produce an attenuated signal. The AFE circuit includes a first amplification stage and a second amplification stage. The first amplification stage has an n-type metal-oxide semiconductor (NMOS) transistor. The NMOS transistor has a gate that receives the attenuated signal from the attenuator circuit. The second amplification stage has a p-type metal-oxide semiconductor (PMOS) transistor. The PMOS transistor has a gate that receives the attenuated signal from the attenuator circuit. Outputs of the first amplification stage and the second amplification stage are electrically coupled to a common output of the AFE circuit.

18 Claims, 6 Drawing Sheets

MULTI-PROTOCOL ANALOG FRONT END CIRCUIT

RELATED APPLICATION

This application claims priority to and the benefit of U.S. Provisional Patent Application Ser. No. 63/255,303, entitled "COMPACT LOW POWER MULTI-PROTOCOL DOUBLE DATA RATE (DDR) RECEIVER FRONT END," filed Oct. 13, 2021, which is incorporated herein by reference in its entirety.

TECHNICAL FIELD

The present disclosure generally relates to electronic devices. In particular, the present disclosure relates to a receiver front end that supports multiple protocols.

BACKGROUND

An analog front-end (AFE) circuit may include amplifiers, filters, or other integrated circuit components that condition electric signals (e.g., analog signals) to be input to other components, such as analog-to-digital converters or controllers (e.g., microcontrollers). For example, the AFE circuits may reduce the noise in the electric signals or improve the dynamic range of the electric signals.

SUMMARY

The present disclosure describes an AFE circuit that supports multiple protocols. According to an embodiment, an apparatus for processing an input signal from a memory includes an attenuator circuit and an AFE circuit. The attenuator circuit attenuates the input signal from the memory to produce an attenuated signal. The AFE circuit includes a first amplification stage and a second amplification stage. The first amplification stage has an n-type metal-oxide semiconductor (NMOS) transistor. The NMOS transistor has a gate that receives the attenuated signal from the attenuator circuit. The second amplification stage has a p-type metal-oxide semiconductor (PMOS) transistor. The PMOS transistor has a gate that receives the attenuated signal from the attenuator circuit. Outputs of the first amplification stage and the second amplification stage are electrically coupled to a common output of the AFE circuit.

The attenuator circuit may include a first parallel resistor-capacitor (RC) circuit and a second parallel RC circuit. The first parallel RC circuit may be electrically coupled to the gate of the NMOS transistor and the gate of the PMOS transistor. The second parallel RC circuit may be electrically coupled between (i) an electrical ground node and (ii) the gate of the NMOS transistor and the gate of the PMOS transistor. One or more of a resistor and a capacitor of the second parallel RC circuit may be adjustable. The resistor may include a series of resistors, and adjusting the resistor may include shorting out one or more of the series of resistors. The capacitor may include a set of parallel capacitors, and adjusting the capacitor may include disconnecting one or more of the set of parallel capacitors.

The first amplification stage may include a first gating switch electrically coupled between the NMOS transistor and a voltage rail. The first gating switch may disable or enable the first amplification stage based on a mode of operation of the memory. The second amplification stage may include a second gating switch electrically coupled between the PMOS transistor and the voltage rail. The second gating switch may disable or enable the second amplification stage based on the mode of operation of the memory. The first gating switch may be enabled and the second gating switch may be disabled when the mode of operation is a double data rate 5 (DDR5) mode, and the first gating switch may be disabled and the second gating switch may be enabled when the mode of operation is a low power DDR5 (LPDDR5) mode. The attenuator circuit may provide a higher level of attenuation when the memory is operating in the DDR5 mode than when the memory is operating in the LPDDR5 mode.

According to another embodiment, a method for processing an input signal from a memory includes attenuating, by an attenuator circuit, the input signal from the memory to produce an attenuated signal and receiving, at a gate of an NMOS transistor of a first amplification stage of an AFE circuit, the attenuated signal from the attenuator circuit. The method also includes receiving, at a gate of a PMOS transistor of a second amplification stage of the AFE circuit, the attenuated signal from the attenuator circuit. Outputs of the first amplification stage and the second amplification stage are electrically coupled to a common output of the AFE circuit.

The attenuator circuit may include a first parallel RC circuit and a second parallel RC circuit. The first parallel RC circuit may be electrically coupled to the gate of the NMOS transistor and the gate of the PMOS transistor. The second parallel RC circuit may be coupled between (i) an electrical ground node and (ii) the gate of the NMOS transistor and the gate of the PMOS transistor. A resistor or a capacitor of the second parallel RC circuit may be adjustable. The resistor may include a series of resistors, and adjusting the resistor may include shorting out one or more of the series of resistors. The capacitor may include a set of parallel capacitors, and adjusting the capacitor may include disconnecting one or more of the set of parallel capacitors.

The method may include enabling or disabling, by a first gating switch electrically coupled between the NMOS transistor and a voltage rail, the first amplification stage based on a mode of operation of the memory and enabling or disabling, by a second gating switch electrically coupled between the PMOS transistor and the voltage rail, the second amplification stage based on the mode of operation of the memory. The first gating switch may be enabled and the second gating switch may be disabled when the memory is operating in a double data rate 5 (DDR5) mode, and the first gating switch may be disabled and the second gating switch may be enabled when the memory is operating in a low power DDR5 (LPDDR5) mode. The attenuator circuit may provide a higher level of attenuation when the memory is operating in the DDR5 mode than when the memory is operating in the LPDDR5 mode.

According to another embodiment, a system for processing an input signal includes a memory, an attenuator circuit, a controller, and an AFE circuit. The memory provides the input signal. The attenuator circuit attenuates the input signal from the memory to produce an attenuated signal. The controller adjusts an attenuation level provided by the attenuator circuit based on a mode of operation of the memory. The AFE circuit includes an NMOS transistor and a PMOS transistor. The NMOS transistor has a gate that receives the attenuated signal from the attenuator circuit. The PMOS transistor has a gate that receives the attenuated signal from the attenuator circuit. Outputs of the NMOS transistor and the PMOS transistor are electrically coupled to a common output of the AFE circuit.

The attenuator circuit may include a first parallel RC circuit and a second parallel RC circuit. The first parallel RC circuit may be electrically coupled to the gate of the NMOS transistor and the gate of the PMOS transistor. The second parallel RC circuit may be electrically coupled between (i) an electrical ground node and (ii) the gate of the NMOS transistor and the gate of the PMOS transistor.

The AFE circuit may include a first gating switch and a second gating switch. The first gating switch may be electrically coupled between the NMOS transistor and a voltage rail. The first gating switch may disable or enable the NMOS transistor based on the mode of operation of the memory. The second gating switch may be electrically coupled between the PMOS transistor and the voltage rail. The second gating switch may disable or enable the PMOS transistor based on the mode of operation of the memory. The first gating switch may be enabled and the second gating switch may be disabled when the memory is operating in a double data rate 5 (DDR5) mode. The first gating switch may be disabled and the second gating switch may be enabled when the memory is operating in a low power DDR5 (LPDDR5) mode.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

As design cycles continue to shrink to meet shorter time-to-market targets, a need has arisen for double data rate (DDR) physical (PHY) interfaces that support multiple protocols (e.g., the DDR5 protocol and the low-power DDR5 (LPDDR5) protocol). Existing systems may use a combo DDR PHY solution that supports both the DDR5 protocol (e.g., including a power terminated memory interface) and the low-power DDR5 (LPDDR5) protocol (e.g., a ground terminated memory interface).

Because an input signal is terminated high (to VDDQ) in a DDR5 system and terminated low (to VSS) in an LPDDR5 system, a receiver generally uses different multi-stage analog front-end (AFE) circuits to receive DDR5 and LPDDR5 signals. The combo solution of a multi-protocol receiver may combine two types of AFEs in a fully parallel implementation by using transmission gates to select different receive paths based on a mode of operation.

Figure 1:
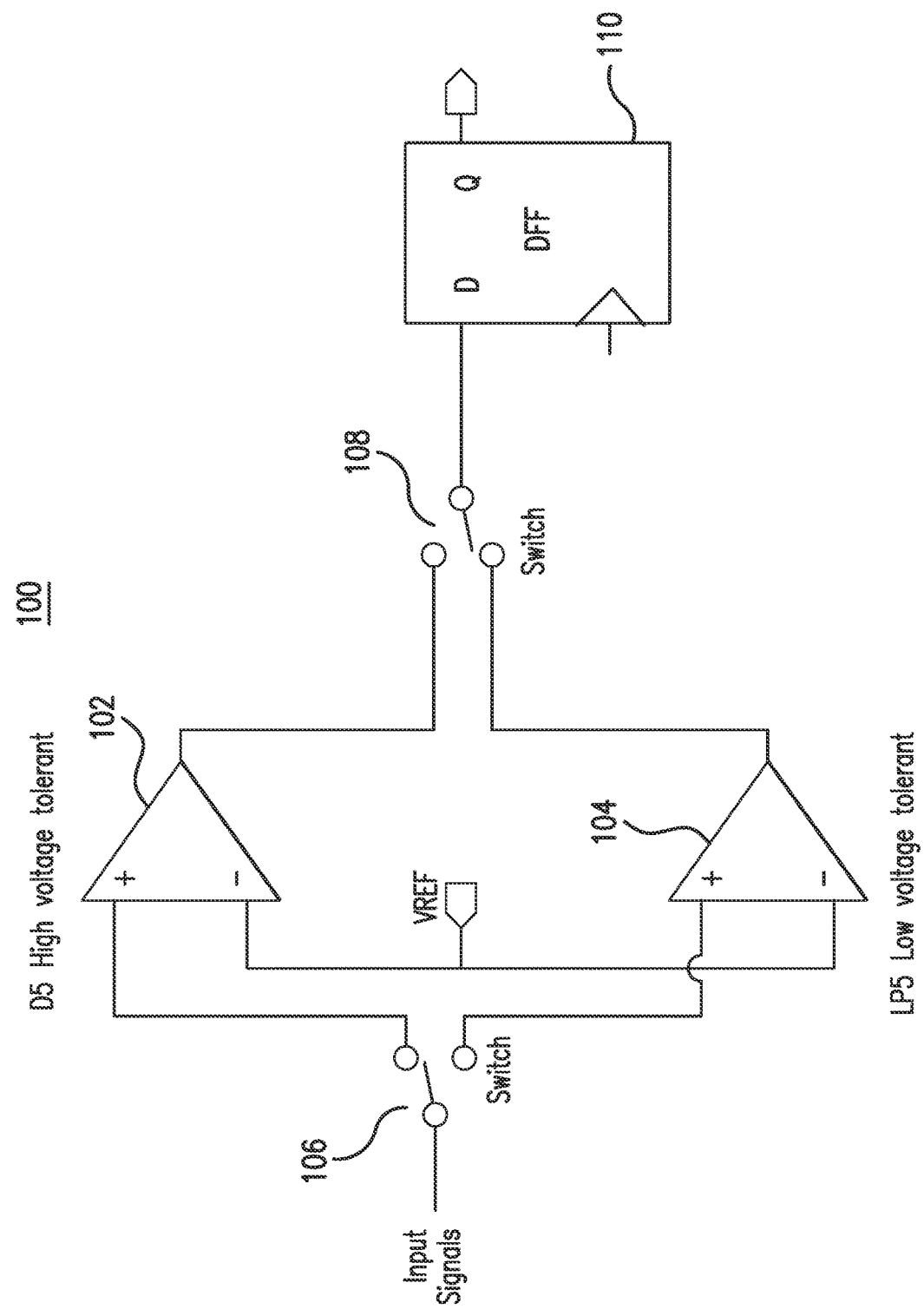
FIG. 1 shows separate AFE circuits that support different double data rate (DDR) protocols.

FIG. 1 shows an example combo solution 100. As seen in FIG. 1, the combo solution 100 includes separate operational amplifiers 102 and 104. One amplifier 102 handles input signals from a DDR5 system that are terminated high. The other amplifier 104 handles input signals from a LPDDR5 system that is terminated low. Two switches 106 and 108, where one switch 106 is at the input of the amplifiers 102 and 104, and another switch 108 is at the output of the amplifiers 102 and 104, control how the input signals travel through the combo solution 100. When the input signals come from a DDR5 system, the switch 106 directs the input signals to the amplifier 102, and the switch 108 directs the output of the amplifier 102 to the flip flop 110 (e.g., a differential flip flop). When the input signals come from an LPDDR5 system, the switch 106 directs the input signals to the amplifier 104, and the switch 108 directs the output of the amplifier 104 to the flip flop 110.

Because of the large voltage range of the supported modes, different high voltage tolerant device types are used for the transmission gates of the amplifiers 102 and 104 as well as at the input of the combo solution 100. The inclusion of the high voltage tolerant devices reduces the performance of the combo solution 100 by adversely impacting the input bandwidth, which limits high frequency applications. Additionally, the additional circuitry and the use of the switches 106 and 108 increases the size of the combo solution 100, and the switches 106 and 108 may not be able to support large loads.

The present disclosure describes an AFE circuit that supports multiple protocols (e.g., DDR5 and LPDDR5). The AFE circuit includes an attenuator circuit that attenuates the voltage of an input signal (e.g., from a memory) to reduce the need for high voltage tolerant devices. Additionally, the AFE circuit includes an amplifier circuit that includes multiple amplification stages, one for each supported protocol. The outputs of the amplification stages are tied at a common output of the amplifier circuit.

In some embodiments, the AFE circuit includes an attenuator circuit configured to attenuate an input signal from a memory to produce an attenuated signal. The AFE circuit also includes an analog front end (AFE) circuit that includes a first amplification stage and a second amplification stage. The first amplification stage has an n-type metal-oxide semiconductor (NMOS) transistor. The NMOS transistor has a gate configured to receive the attenuated signal from the attenuator circuit. The second amplification stage has a p-type metal-oxide semiconductor (PMOS) transistor. The PMOS transistor has a gate configured to receive the attenuated signal from the attenuator circuit. Outputs of the first amplification stage and the second amplification stage are electrically coupled to a common output of the AFE circuit.

The present AFE circuit provides several technical advantages. For example, the present AFE circuit reduces the need for high voltage tolerant components, which reduces the size of the AFE circuit relative to a combo solution. Additionally, the input bandwidth of the AFE circuit is increased relative to the combo solution.

Figure 2:
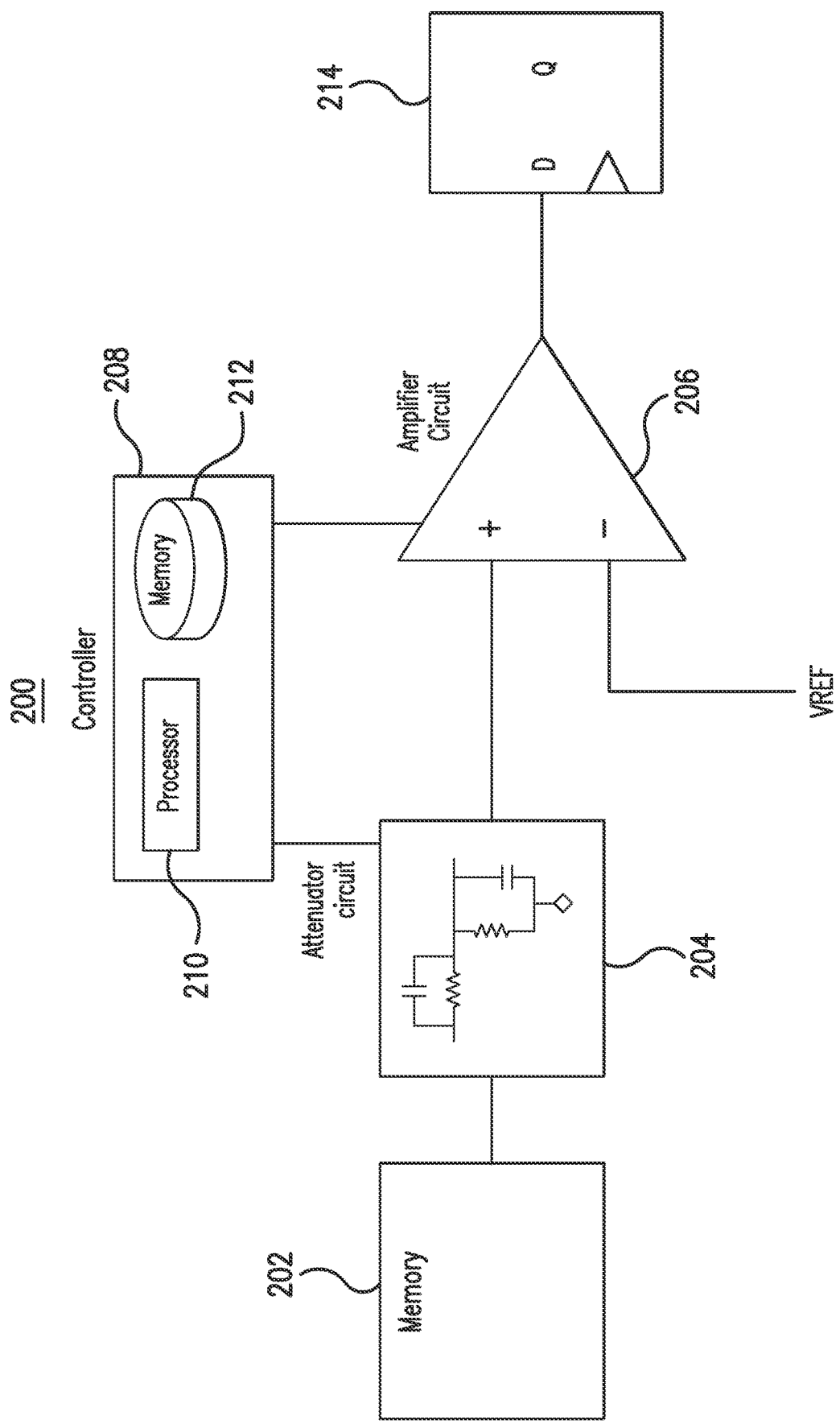
FIG. 2 illustrates an example system for conditioning signals.

FIG. 2 illustrates an example system 200 for conditioning signals. As shown in FIG. 2, the system 200 includes a memory 202, an attenuator circuit 204, an amplifier circuit 206, a controller 208, and a flip flop 214. The system 200 may be part of a larger system (e.g., the computer system 600 shown in FIG. 6). Generally, the attenuator circuit 204, the amplifier circuit 206, the controller 208, and the flip flop 214 operate as an AFE circuit that conditions input signals from the memory 202. In certain embodiments, the attenuator circuit 204 attenuates the voltage of the input signals from the memory 202 to reduce the need for high voltage tolerant components in the amplifier circuit 206.

The memory 202 may store retrievable information. The information retrieved from the memory 202 may be communicated as electrical signals to other components of the system 200. The other components condition the electrical signals (e.g., by filtering or amplifying the electrical signals). The memory 202 may be any suitable memory (e.g., a DDR5 memory or a LPDDR5 memory). In the example of FIG. 2, the output of the memory 202 is electrically coupled to the input of the attenuator circuit 204. The present disclosure is not limited to the memory 202 being the source of input signals in the system 200. Any suitable generator or source of input signals may be included in place of the memory 202 in the system 200.

The attenuator circuit 204 receives input signals from the memory 202. The attenuator circuit 204 may include one or more resistor-capacitor (RC) circuits that attenuate the voltage of the input signals. In some embodiments, some of the RC circuits include variable resistors or capacitors with adjustable resistances or capacitances. For example, some of the variable resistors may be formed using a series of resistors, and some of the resistors in the series may be shorted to adjust the overall resistance of the series. As another example, some of the variable capacitors may be formed using a set of parallel capacitors, and some of the capacitors may be removed or disconnected to adjust the overall capacitance of the set. By adjusting the resistances and capacitances, the amount of attenuation provided by the attenuator circuit 204 is adjusted. As a result, the attenuator circuit 204 may be adjusted to provide a level of attenuation needed by the voltage of the input signals (e.g., to prevent overloading low voltage tolerant components of the amplifier circuit 206). The output of the attenuator circuit 204 is electrically coupled to an input of the amplifier circuit 206.

The amplifier circuit 206 amplifies the attenuated signals from the attenuator circuit 204. As seen in FIG. 2, the amplifier circuit 206 receives the attenuated signal from the attenuator circuit 204 and a reference signal (VREF) at the inputs of the amplifier circuit 206. In certain embodiments, the amplifier circuit 206 includes multiple amplification stages designed to support different protocols. For example, the amplifier circuit 206 may include a first amplification stage designed to amplify attenuated DDR5 signals and a second amplification stage designed to amplify LPDDR5 signals. Depending on the operational mode (e.g., DDR5 or LPDDR5), different amplification stages may be enabled or disabled. The outputs of the amplification stages are tied to a common output of the amplifier circuit 206. The output of the amplifier circuit 206 is electrically coupled to an input of the flip flop 214.

The flip flop 214 stores or holds the output of the amplifier circuit 206. In some embodiments, the flip flop 214 is a differential flip flop (D flip flop) that stores or holds the output of the amplifier circuit 206 on a clock edge (e.g., a falling clock edge). The flip flop 214 then outputs the stored or held value for the following clock cycle.

The controller 208 controls the operation of the system 200. For example, the controller 208 may adjust or set the resistances and capacitances of the components in the attenuator circuit 204 depending on how much attenuation is needed to prevent overloading the low voltage tolerant components in the amplifier circuit 206. As another example, the controller 208 may enable or disable the different amplification stages of the amplifier circuit 206 depending on the operational mode of the memory 202. For example, the controller 208 may detect whether the memory is a DDR5 memory or a LPDDR5 memory. The controller 208 may then enable or disable the amplification stages designed to handle DDR5 signals or LPDDR5 signals accordingly. In some embodiments, when a user connects the memory 202 to the attenuator circuit 204, the user may inform the controller 208 what type of input signals the memory 202 provides (e.g., DDR5 or LPDDR5 input signals). The controller 208 then sets the attenuation level of the attenuation circuit 204 and the amplifier stage used by the amplifier circuit 206 accordingly. As seen in FIG. 2, the controller 208 includes a processor 210 and a memory 212, which may be configured to perform the actions or functions of the controller 208 described herein.

The processor 210 is any electronic circuitry, including, but not limited to one or a combination of microprocessors, microcontrollers, application specific integrated circuits (ASIC), application specific instruction set processor (ASIP), and/or state machines, that communicatively couples to memory 212 and controls the operation of the controller 208. The processor 210 may be 8-bit, 16-bit, 32-bit, 64-bit or of any other suitable architecture. The processor 210 may include an arithmetic logic unit (ALU) for performing arithmetic and logic operations, processor registers that supply operands to the ALU and store the results of ALU operations, and a control unit that fetches instructions from memory and executes them by directing the coordinated operations of the ALU, registers and other components. The processor 210 may include other hardware that operates software to control and process information. The processor 210 executes software stored on the memory 212 to perform any of the functions described herein. The processor 210 controls the operation and administration of the controller 208 by processing information (e.g., information received from the memory 202, amplifier circuit 206, and memory 212). The processor 210 is not limited to a single processing device and may encompass multiple processing devices.

The memory 212 may store, either permanently or temporarily, data, operational software, or other information for the processor 210. The memory 212 may include any one or a combination of volatile or non-volatile local or remote devices suitable for storing information. For example, the memory 212 may include random access memory (RAM), read only memory (ROM), magnetic storage devices, optical storage devices, or any other suitable information storage device or a combination of these devices. The software represents any suitable set of instructions, logic, or code embodied in a computer-readable storage medium. For example, the software may be embodied in the memory 212, a disk, a CD, or a flash drive. In particular embodiments, the software may include an application executable by the processor 210 to perform one or more of the functions described herein.

As described, one of the challenges in designing a multi-protocol AFE circuit is the different input signal levels. DDR5 systems are VDDQ terminated, and the input signal is high enough that a high voltage tolerant device should be used. LPDDR5 systems are VSS terminated, and the input signal is low enough that a high voltage tolerant device may not be used. To design an AFE circuit that supports both protocols, the attenuator circuit 204, which may be a programmable passive attenuator, is used to attenuate the DDR5 input signal (e.g., by reducing the input signal voltage).

Figure 3:
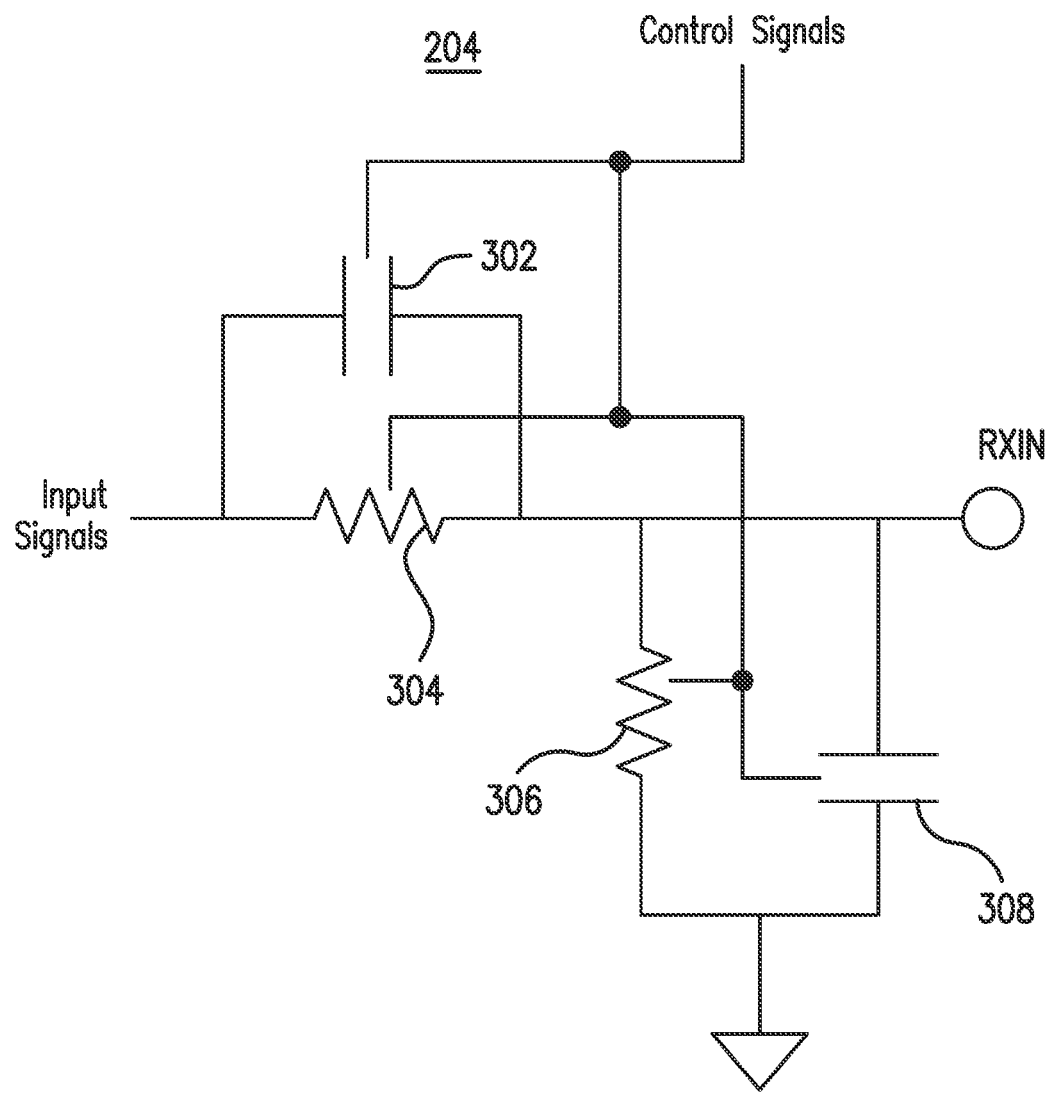
FIG. 3 illustrates an example attenuator circuit in the system of FIG. 2.

FIG. 3 illustrates an example attenuator circuit 204 in the system 200 of FIG. 2. As seen in FIG. 3, the attenuator circuit 204 includes a capacitor 302, a resistor 304, a resistor 306, and a capacitor 308. The capacitor 302 and the resistor 304 are connected in parallel with each other to form a first RC circuit, and the resistor 306 and the capacitor 308 are connected in parallel with each other to form a second RC circuit. The first RC circuit is positioned between an input of the attenuator circuit 204 and the output of the attenuator circuit 204 (RXIN). The second RC circuit is positioned between the output of the attenuator circuit 204 (RXIN) and an electrical ground node.

The resistors 304 and 306 may set the attenuation level of the attenuator circuit 204 for direct current (DC) and low frequency input signals, and the capacitors 302 and 308 may set the attenuation level of the attenuator circuit 204 for high frequency input signals. In some aspects, one or both of the resistance of the resistor 306 and the capacitance of the capacitor 308 may be adjustable to implement various attenuation levels for different bands. A high attenuation level may be set for DDR5 input signals, and a low attenuation level may be set for LPDDR5 input signals. In certain embodiments, the controller 208 (shown in FIG. 2) detects the operation mode (e.g., DDR5 or LPDDR5) of the memory 202 (shown in FIG. 2) electrically coupled to the attenuator circuit 204 and adjusts the attenuation level of the attenuator circuit 204 accordingly.

In some embodiments, one or more of the resistors 304 and 306 are formed using a series of resistors. The resistance of the series is adjusted by short circuiting one or more of the resistors in the series. For example, the controller 208 may determine which resistors in the series to short so that the series of resistors has a resistance that provides a desired attenuation level. The controller 208 may then send control signals to the series of resistors to short one or more of the resistors in the series (e.g., by closing one or more switches that are connected in parallel to the one or more resistors). By One or more of the capacitors 302 and 308 may be formed using a set of parallel capacitors. The capacitance of the set is adjusted by removing or disconnecting one or more of the capacitors in the set. For example, the controller 208 may determine which capacitors in the set to remove or disconnect so that the set of capacitors has a capacitance that provides a desired attenuation level. The controller may then send control signals to the set of capacitors to disconnect one or more of the capacitors in the set (e.g., by opening one or more switches that are connected in series to the one or more capacitors). In one example, increasing the capacitance of the capacitor 308 or decreasing the resistance of the resistor 306 may increase the attenuation provided by the attenuator circuit 204.

Figure 4:
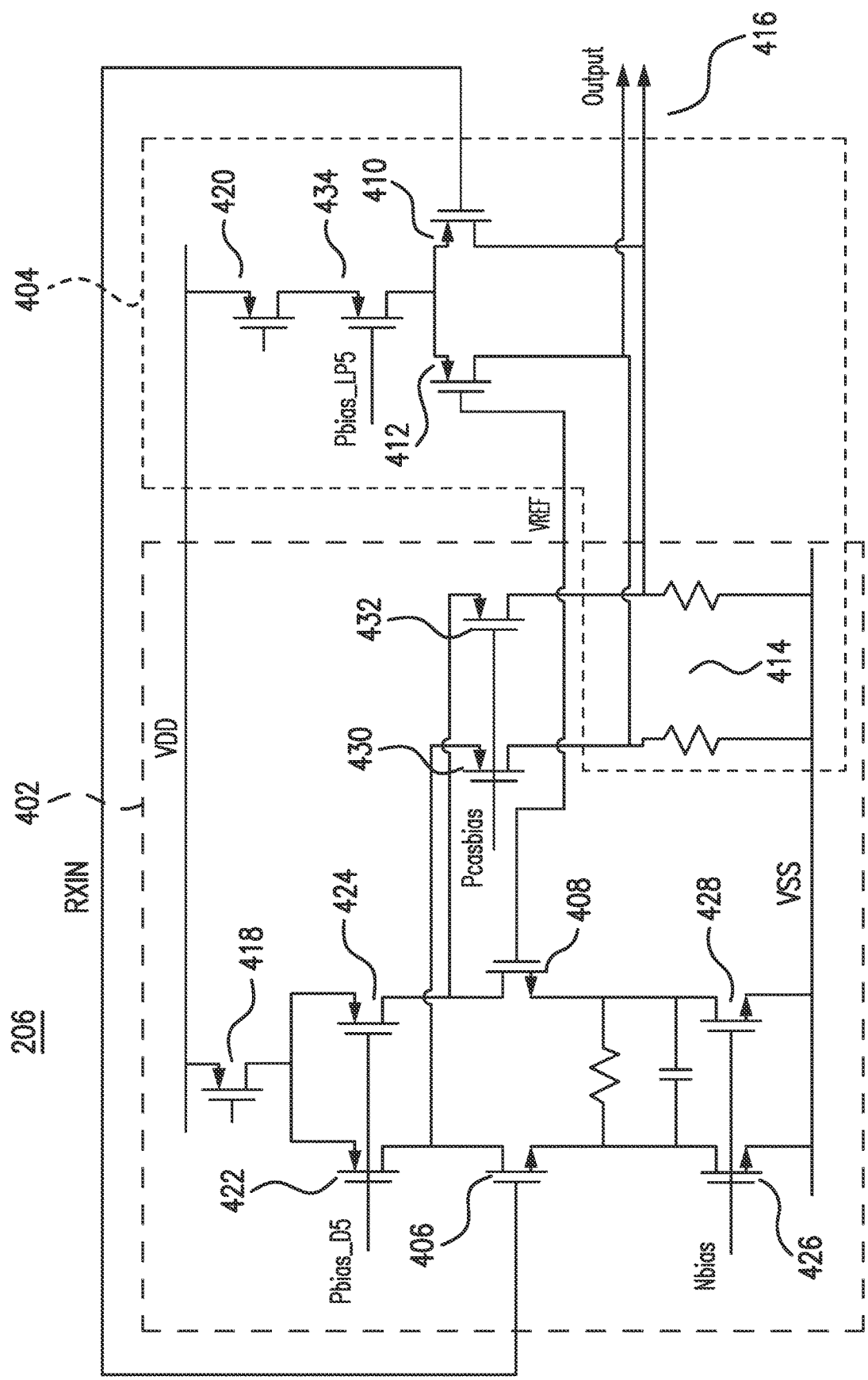
FIG. 4 illustrates an example amplifier circuit in the system of FIG. 2.

FIG. 4 shows an example amplifier circuit 206 in the system 200 of FIG. 2. As seen in FIG. 4, the amplifier circuit 206 includes a first amplification stage 402 and a second amplification stage 404. The first amplification stage 402 may be enabled to provide a first level of amplification (e.g., for DDR5 signals), and the second amplification stage 404 may be enabled to provide a second level of amplification (e.g., for LPDDR5 signals). The input of the amplifier circuit 206 is a signal from the output of the attenuator circuit 204 (RXIN).

The amplification stage 402 includes the transistors 406 and 408. The transistors 406 and 408 may be NMOS transistors that form an NMOS input pair of a folded cascode amplifier that receives a high common mode DDR5 input signal. The amplification stage 404 includes the transistors 410 and 412. The transistors 410 and 412 may be PMOS transistors that form a PMOS input pair of a current-mode logic amplifier that receives a low common mode LPDDR5 input signal. Stated differently, because a DDR5 input signal is terminated high (e.g., via an impedance between the input port and supply rail), the input pair that handles the DDR5 input signal is implemented as NMOS transistors, and because a LPDDR5 input signal is terminated low (e.g., via an impedance between the input port and electrical ground), the input pair that handles the LPDDR5 input signal is implemented as PMOS transistors.

Both the amplification stage 402 and the amplification stage 404 share the same resistive load 414. As a result, the outputs of the amplification stages 402 and 404 form a common output 416 at the output of the amplifier circuit 206. The output signal of the amplifier circuit 206 will be either the output of the amplification stage 402 or the output of the amplification stage 404 depending on the operational mode (e.g., DDR5 or LPDDR5), in certain embodiments.

Power gating devices (e.g., gating switches) implemented using the transistors 418 and 420 are used to enable and disable each amplification stage 402 or 404 based on a mode of operation. For example, the transistor 418 may be turned on and the transistor 420 turned off if the mode of operation is DDR5, and the transistor 420 may be turned on and the transistor 418 turned off if the mode of operation is LPDDR5. In some embodiments, the controller 208 (shown in FIG. 2) controls the signal to the gates of the transistors 418 and 420 to turn on or turn off the transistors 418 and 420 depending on the operational mode. The transistor 418 is electrically connected between the ground rail (VDD) and the transistor 406. The transistor 420 is electrically connected between the ground rail (VDD) and the transistor 410.

The amplification stage 402 also includes the transistors 422, 424, 426, 428, 430, and 432, and the amplification stage 404 also includes the transistor 434. The transistors 422 and 424 are controlled with the bias Pbias_D5. The transistors 426 and 428 are controlled using the bias Nbias. The transistors 430 and 432 are controlled using the bias Pcasbias. The transistor 434 is controlled using the bias Pbias_LP5. Each of the biases (Pbias_D5, Pcasbias, Nbias, and Pbias_LP5) may also be turned on or off depending on the mode of operation. The controller 208 may control the bias signals (Pbias_D5, Pcasbias, Nbias, and Pbias_LP5). Stated differently, the transistors 422, 424, 426, 428, 430, and 432 are biased if the mode of operation is DDR5 and not biased if the mode of operation is LPDDR5. The transistor 434 is biased if the mode of operation is LPDDR5 and not biased if the mode of operation is DDR5.

Figure 5:
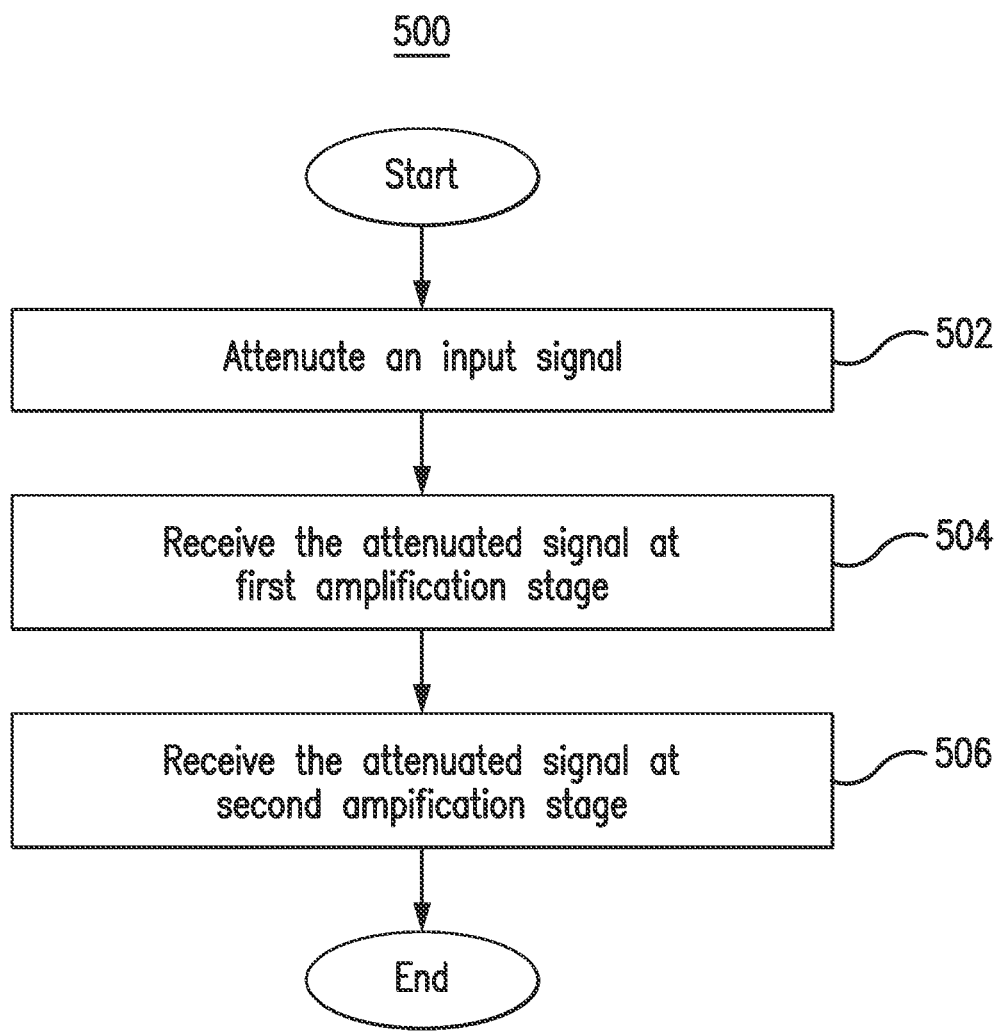
FIG. 5 is a flowchart of an example method performed in the system of FIG. 2.

FIG. 5 is a flowchart of an example method 500 performed in the system 200 of FIG. 2. In particular embodiments, various components of the system 200 perform the steps of the method 500. By performing the method 500, the system 200 may condition signals of different protocols (e.g., DDR5 signals and LPDDR5 signals).

At 502, the attenuator circuit 204 attenuates an input signal. In some embodiments, the input signal is produced by the memory 202 connected to the input of the attenuator circuit 204. The attenuator circuit may include the capacitor 302 and the resistor 304 connected in parallel with each other to form a first RC circuit and the resistor 306 and the capacitor 308 connected in parallel with each other to form a second RC circuit. The first RC circuit is connected between the input and the output of the attenuator circuit 204. The second RC circuit is connected between the output of the attenuator circuit 204 and ground. In certain embodiments, one or more of the capacitors 302 and 308 have variable/programmable/adjustable capacitances, and one or more of the resistors 304 and 306 have variable/programmable/adjustable resistances. For example, one or more of the capacitors 302 and 308 may be formed using a set of parallel capacitors. One or more of the capacitors of the set may be disconnected or removed to adjust the capacitance of the set of capacitors. As another example, one or more of the resistors 304 and 306 may be formed using a series of resistors. One or more of the series may be short circuited to adjust the resistance of the series of resistors. In some embodiments, the controller 208 adjusts the capacitances and resistances of the RC circuits so that the attenuator circuit 204 provides a desired level of attenuation.

At 504, the first amplification stage 402 of the amplifier circuit 206 receives an attenuated signal from the attenuator circuit 204. The attenuated signal may be provided to the gate of the transistor 406 in the first amplification stage 402. In some embodiments, the first amplification stage 402 is enabled if the input signal is a DDR5 signal. For example, the controller 208 may detect that the memory 202 provided a DDR5 input signal, and in response, enable the first amplification stage 402 by turning on the transistor 418. The controller 208 may also disable the second amplification stage 404 by turning off the transistor 420. The first amplification stage 402 and the transistor 406 amplify the attenuated signal and provide the output at the common output 416 of the amplifier circuit 206.

At 506, the second amplification stage 404 of the amplifier circuit 206 receives the attenuated signal from the attenuator circuit 204. In some embodiments, the second amplification stage 404 is enabled if the input signal is a LPDDR5 signal. For example, the controller 208 may detect that the memory 202 provided a LPDDR5 input signal, and in response, enable the second amplification stage 404 by turning on the transistor 420. The controller 208 may also disable the first amplification stage 402 by turning off the transistor 418. The second amplification stage 404 and the transistor 410 amplify the attenuated signal and provide the output at the common output 416 of the amplifier circuit 206.

Figure 6:
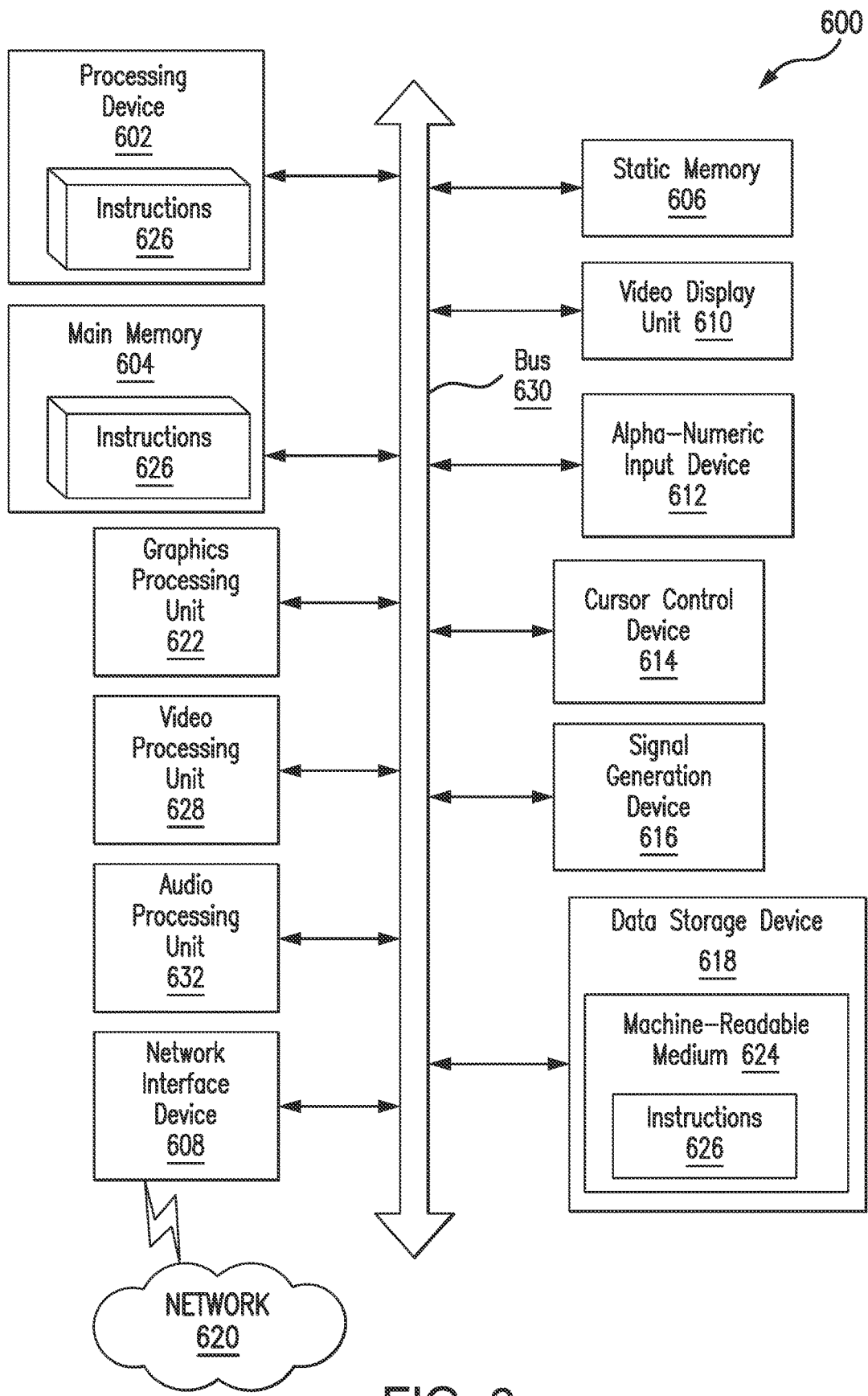
FIG. 6 illustrates an example computing system.

FIG. 6 illustrates an example of a computer system 600 within which a set of instructions, for causing the computer system to perform any one or more of the methodologies discussed herein, may be executed. In some implementations, the computer system may be connected (e.g., networked) to other machines or computer systems in a local area network (LAN), an intranet, an extranet, and/or the Internet. The computer system may operate in the capacity of a server or a client computer system in client-server network environment, as a peer computer system in a peer-to-peer (or distributed) network environment, or as a server or a client computer system in a cloud computing infrastructure or environment.

The computer system may be a personal computer (PC), a tablet PC, a set-top box (STB), a personal digital assistant (PDA), a cellular telephone, a web appliance, a server, a network router, a switch or bridge, or any machine capable of executing a set of instructions (sequential or otherwise) that specify actions to be taken by that computer system. Further, while a single computer system is illustrated, the term computer system shall also be taken to include any collection of computer systems that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM), a static memory 606 (e.g., flash memory, static random access memory (SRAM), etc.), and a data storage device 618, which communicate with each other via a bus 630. The main memory 604 includes or is a non-transitory computer readable medium. The main memory 604 (e.g., a non-transitory computer readable medium) can store one or more sets of instructions 626, that when executed by the processing device 602, cause the processing device 602 to perform some or all of the operations, steps, methods, and processes described herein.

Processing device 602 represents one or more processors such as a microprocessor, a central processing unit, or the like. More particularly, the processing device 602 may be or include complex instruction set computing (CISC) microprocessor, reduced instruction set computing (RISC) microprocessor, very long instruction word (VLIW) microprocessor, a processor implementing other instruction sets, or processor(s) implementing a combination of instruction sets. Processing device 602 may also be one or more special-purpose processing devices such as an application specific integrated circuit (ASIC), a field programmable gate array (FPGA), a digital signal processor (DSP), network processor, or the like. The processing device 602 may be configured to execute instructions 626 for performing some or all of the operations, steps, methods, and processes described herein.

The computer system 600 may further include a network interface device 608 to communicate over the network 620. The computer system 600 also may include a video display unit 610 (e.g., a liquid crystal display (LCD) or a cathode ray tube (CRT)), an alphanumeric input device 612 (e.g., a keyboard), a cursor control device 614 (e.g., a mouse), a graphics processing unit 622, a signal generation device 616 (e.g., a speaker), graphics processing unit 622, video processing unit 628, and audio processing unit 632.

The data storage device 618 may include a machine-readable storage medium 624 (e.g., a non-transitory computer-readable medium) on which is stored one or more sets of instructions 626 or software embodying any one or more of the methodologies or functions described herein. The instructions 626 may also reside, completely or at least partially, within the main memory 604 and/or within the processing device 602 during execution thereof by the computer system 600, the main memory 604 and the processing device 602 also including machine-readable storage media. The main memory 604 may include a memory controller having an attenuator and AFE circuit, as described herein.

In some implementations, the instructions 626 include instructions to implement functionality described above. While the machine-readable storage medium 624 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the computer system and that cause the computer system and the processing device 602 to perform any one or more of the methodologies described above. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs) (e.g., double data rate (DDR) memory), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory (ROM), random access memory (RAM) (e.g., DDR memory), magnetic disk storage media, optical storage media, flash memory devices, etc.

In the foregoing disclosure, implementations of the disclosure have been described with reference to specific example implementations thereof. It will be evident that various modifications may be made thereto without departing from the broader scope of implementations of the disclosure as set forth in the following claims. In addition, an illustrated example implementation need not have all the aspects or advantages shown. An aspect or an advantage described in conjunction with a particular example implementation is not necessarily limited to that example implementation and can be practiced in any other example implementations even if not so illustrated or if not so explicitly described. Where the disclosure refers to some elements in the singular tense, more than one element can be depicted in the figures and like elements are labeled with like numerals. The disclosure and drawings are, accordingly, to be regarded in an illustrative sense rather than a restrictive sense. Further, methods described herein may be described in a particular order of operations, but other methods according to other examples may be implemented in various other orders (e.g., including different serial or parallel performance of various operations) with more or fewer operations.

What is claimed is:

1. An apparatus for processing an input signal from a memory, the apparatus comprising:
   an attenuator circuit comprising (i) a first parallel resistor-capacitor (RC) circuit and (ii) a second parallel RC circuit, wherein the attenuator circuit is configured to attenuate the input signal from the memory to produce an attenuated signal; and
   an analog front end (AFE) circuit comprising:
      a first amplification stage having an n-type metal-oxide semiconductor (NMOS) transistor, the NMOS transistor having a gate configured to receive the attenuated signal from the attenuator circuit; and
      a second amplification stage having a p-type metal-oxide semiconductor (PMOS) transistor, the PMOS transistor having a gate configured to receive the attenuated signal from the attenuator circuit, wherein outputs of the first amplification stage and the second amplification stage are electrically coupled to a common output of the AFE circuit, wherein the first parallel RC circuit is electrically coupled to the gate of the NMOS transistor and the gate of the PMOS transistor, and wherein the second parallel RC circuit is electrically coupled between (i) an electrical ground node and (ii) the gate of the NMOS transistor and the gate of the PMOS transistor.

2. The apparatus of claim 1, wherein one or more of a resistor and a capacitor of the second parallel RC circuit is adjustable.

3. The apparatus of claim 2, wherein the resistor comprises a series of resistors, and wherein adjusting the resistor comprises shorting out one or more of the series of resistors.

4. The apparatus of claim 2, wherein the capacitor comprises a set of parallel capacitors, and wherein adjusting the capacitor comprises disconnecting one or more of the set of parallel capacitors.

5. The apparatus of claim 1, wherein:
   the first amplification stage comprises a first gating switch electrically coupled between the NMOS transistor and a voltage rail, the first gating switch configured to disable or enable the first amplification stage based on a mode of operation of the memory; and
   the second amplification stage comprises a second gating switch electrically coupled between the PMOS transistor and the voltage rail, the second gating switch configured to disable or enable the second amplification stage based on the mode of operation of the memory.

6. The apparatus of claim 5, wherein the first gating switch is enabled and the second gating switch is disabled when the mode of operation is a double data rate 5 (DDR5) mode, and wherein the first gating switch is disabled and the second gating switch is enabled when the mode of operation is a low power DDR5 (LPDDR5) mode.

7. The apparatus of claim 6, wherein the attenuator circuit provides a higher level of attenuation when the memory is operating in the DDR5 mode than when the memory is operating in the LPDDR5 mode.

8. A method for processing an input signal from a memory, the method comprising:
   attenuating, by an attenuator circuit comprising a first parallel RC circuit and a second parallel RC circuit, the input signal from the memory to produce an attenuated signal;
   receiving, at a gate of an NMOS transistor of a first amplification stage of an AFE circuit, the attenuated signal from the attenuator circuit; and
   receiving, at a gate of a PMOS transistor of a second amplification stage of the AFE circuit, the attenuated signal from the attenuator circuit, wherein outputs of the first amplification stage and the second amplification stage are electrically coupled to a common output of the AFE circuit, wherein the first parallel RC circuit is electrically coupled to the gate of the NMOS transistor and the gate of the PMOS transistor, and wherein the second parallel RC circuit is electrically coupled between (i) an electrical ground node and (ii) the gate of the NMOS transistor and the gate of the PMOS transistor.

9. The method of claim 8, wherein a resistor or a capacitor of the second parallel RC circuit is adjustable.

10. The method of claim 9, wherein the resistor comprises a series of resistors, and wherein adjusting the resistor comprises shorting out one or more of the series of resistors.

11. The method of claim 9, wherein the capacitor comprises a set of parallel capacitors, and wherein adjusting the capacitor comprises disconnecting one or more of the set of parallel capacitors.

12. The method of claim 8, further comprising:
   enabling or disabling, by a first gating switch electrically coupled between the NMOS transistor and a voltage rail, the first amplification stage based on a mode of operation of the memory; and
   enabling or disabling, by a second gating switch electrically coupled between the PMOS transistor and the voltage rail, the second amplification stage based on the mode of operation of the memory.

13. The method of claim 12, wherein the first gating switch is enabled and the second gating switch is disabled when the memory is operating in a DDR5 mode, and wherein the first gating switch is disabled and the second gating switch is enabled when the memory is operating in a LPDDR5 mode.

14. The method of claim 13, wherein the attenuator circuit provides a higher level of attenuation when the memory is operating in the DDR5 mode than when the memory is operating in the LPDDR5 mode.

15. A system for processing an input signal, the system comprising:
   a memory configured to provide the input signal;
   an attenuator circuit comprising a first parallel RC circuit, wherein the attenuator circuit is configured to attenuate the input signal from the memory to produce an attenuated signal;
   a controller configured to adjust an attenuation level provided by the attenuator circuit based on a mode of operation of the memory; and
   an AFE circuit comprising:
      an NMOS transistor having a gate configured to receive the attenuated signal from the attenuator circuit; and
      a PMOS transistor having a gate configured to receive the attenuated signal from the attenuator circuit, wherein outputs of the NMOS transistor and the PMOS transistor are electrically coupled to a common output of the AFE circuit, and wherein the first parallel RC circuit is electrically coupled to the gate of the NMOS transistor and the gate of the PMOS transistor.

16. The system of claim 15, wherein the attenuator circuit comprises a second parallel RC circuit electrically coupled between (i) an electrical ground node and (ii) the gate of the NMOS transistor and the gate of the PMOS transistor.

17. The system of claim 15, wherein AFE circuit further comprises:
   a first gating switch electrically coupled between the NMOS transistor and a voltage rail, the first gating switch configured to disable or enable the NMOS transistor based on the mode of operation of the memory; and
   a second gating switch electrically coupled between the PMOS transistor and the voltage rail, the second gating switch configured to disable or enable the PMOS transistor based on the mode of operation of the memory.

18. The system of claim 17, wherein the first gating switch is enabled and the second gating switch is disabled when the memory is operating in a DDR5 mode, and wherein the first gating switch is disabled and the second gating switch is enabled when the memory is operating in a LPDDR5 mode.

* * * * *